(12) United States Patent
Liu

(10) Patent No.: US 12,400,838 B2
(45) Date of Patent: Aug. 26, 2025

(54) TEMPERATURE-CONTROLLED PLASMA GENERATION SYSTEM

(71) Applicant: Taiwan Semiconductor Manufacturing Co., Ltd., Hsinchu (TW)

(72) Inventor: Li-Shi Liu, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 338 days.

(21) Appl. No.: 17/875,524

(22) Filed: Jul. 28, 2022

(65) Prior Publication Data

US 2022/0367153 A1    Nov. 17, 2022

Related U.S. Application Data

(62) Division of application No. 16/437,591, filed on Jun. 11, 2019, now Pat. No. 11,424,107.

(60) Provisional application No. 62/691,916, filed on Jun. 29, 2018.

(51) Int. Cl.
*H01L 21/67* (2006.01)
*H01J 37/32* (2006.01)

(52) U.S. Cl.
CPC ..... *H01J 37/32522* (2013.01); *H01J 37/3211* (2013.01); *H01J 37/32119* (2013.01); *H01J 37/32449* (2013.01); *H01L 21/67069* (2013.01); *H01J 2237/002* (2013.01); *H01J 2237/24585* (2013.01); *H01J 2237/332* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 6,015,465 A | 1/2000 | Kholodenko et al. | |
| 6,048,798 A | 4/2000 | Gadgil et al. | |
| 6,326,597 B1 | 12/2001 | Lubomirsky et al. | |
| 10,921,773 B2 * | 2/2021 | Yamamoto | H01L 21/67109 |
| 2002/0007795 A1 | 1/2002 | Bailey, III et al. | |
| 2002/0153350 A1 | 10/2002 | Lu et al. | |

(Continued)

FOREIGN PATENT DOCUMENTS

| | | |
|---|---|---|
| CN | 1423826 A | 6/2003 |
| CN | 101663417 A | 3/2010 |

(Continued)

OTHER PUBLICATIONS

Office Action directed to related Chinese Patent Application No. 201910578357, mailed Jun. 23, 202 1; 1 2 pages.

*Primary Examiner* — Roberts P Culbert
(74) *Attorney, Agent, or Firm* — Sterne, Kessler, Goldstein & Fox P.L.L.C.

(57) ABSTRACT

The present disclosure relates to a plasma generation system with a dielectric window, an inductive coil disposed on the dielectric window, a gas distribution element disposed on the dielectric window, and a gas conditioning system coupled to the gas distribution element. The gas distribution element is configured to discharge a thermally conditioned gas on the dielectric window and regulate a temperature across the dielectric window. The gas conditioning system is configured to supply the thermally conditioned gas to the gas distribution element.

20 Claims, 9 Drawing Sheets

(56) References Cited

U.S. PATENT DOCUMENTS

| | | | |
|---|---|---|---|
| 2004/0065645 | A1 | 4/2004 | Welch et al. |
| 2005/0205013 | A1 | 9/2005 | Nakanishi et al. |
| 2008/0134974 | A1 | 6/2008 | Takahashi et al. |
| 2008/0178805 | A1 | 7/2008 | Paterson et al. |
| 2008/0242085 | A1 | 10/2008 | Fischer et al. |
| 2011/0168673 | A1 | 7/2011 | Nishimoto |
| 2013/0228283 | A1 | 9/2013 | McChesney et al. |
| 2014/0312761 | A1 | 10/2014 | Tamagaki |
| 2015/0348757 | A1 | 12/2015 | Stowell et al. |
| 2016/0104604 | A1 | 4/2016 | Kim et al. |
| 2018/0156489 | A1 | 6/2018 | Sriraman et al. |
| 2020/0251312 | A1 | 8/2020 | Liu |

FOREIGN PATENT DOCUMENTS

| | | |
|---|---|---|
| CN | 102077320 A | 5/2011 |
| CN | 103947301 A | 7/2014 |
| JP | 3576464 B2 | 10/2004 |
| TW | 565623 B | 12/2003 |
| TW | I623960 B | 5/2018 |

\* cited by examiner

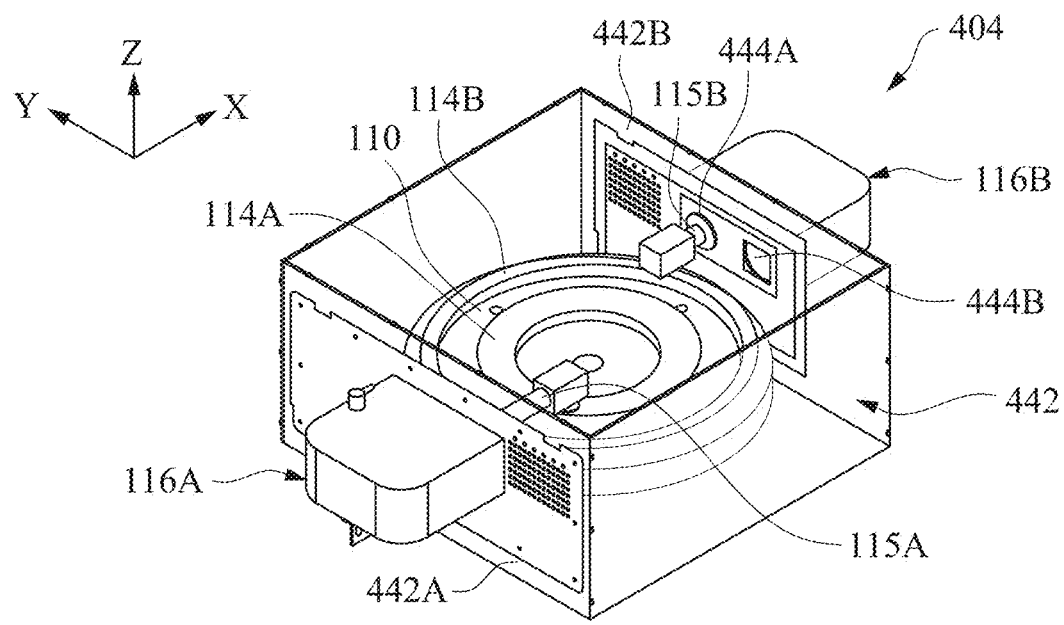
FIG. 4
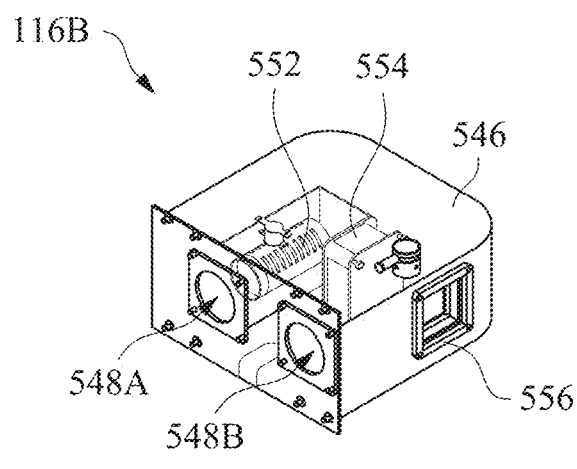
FIG. 5A
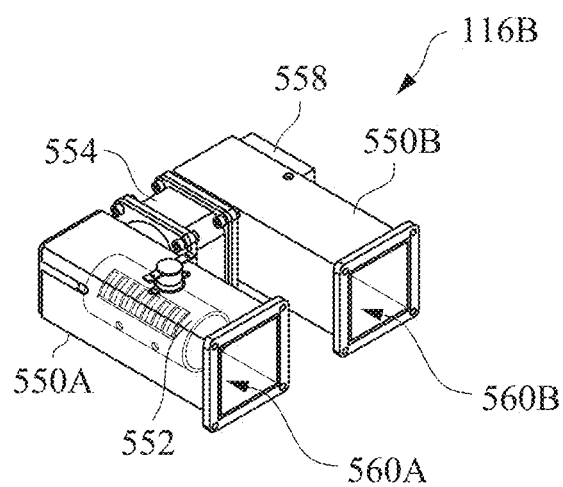
FIG. 5B
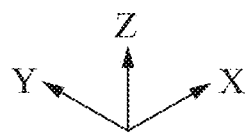
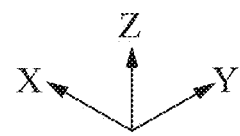

TEMPERATURE-CONTROLLED PLASMA GENERATION SYSTEM

CROSS-REFERENCE TO RELATED APPLICATIONS

This application is a divisional of U.S. patent application Ser. No. 16/437,591, titled "Temperature-Controlled Plasma Generation System," filed Jun. 11, 2019, which claims the benefit of U.S. Provisional Patent Application No. 62/691,916, titled "Dual Zone Heating System of Upper Electrode," filed Jun. 29, 2018, each of which is incorporated by reference herein in its entirety.

BACKGROUND

With advances in semiconductor technology, there has been an increasing demand for higher storage capacity, faster processing systems, higher performance, and lower costs. To meet these demands, the semiconductor industry continues to scale down the dimensions of semiconductor devices. Such scaling down has increased the complexity of semiconductor manufacturing processes and the demands for temperature regulation in semiconductor manufacturing systems.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

FIG. 4 illustrates an isometric view of a temperature-controlled plasma generation system, in accordance with some embodiments.

FIGS. 5A-5B illustrate isometric views of gas conditioning systems of a temperature-controlled plasma generation system, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1:
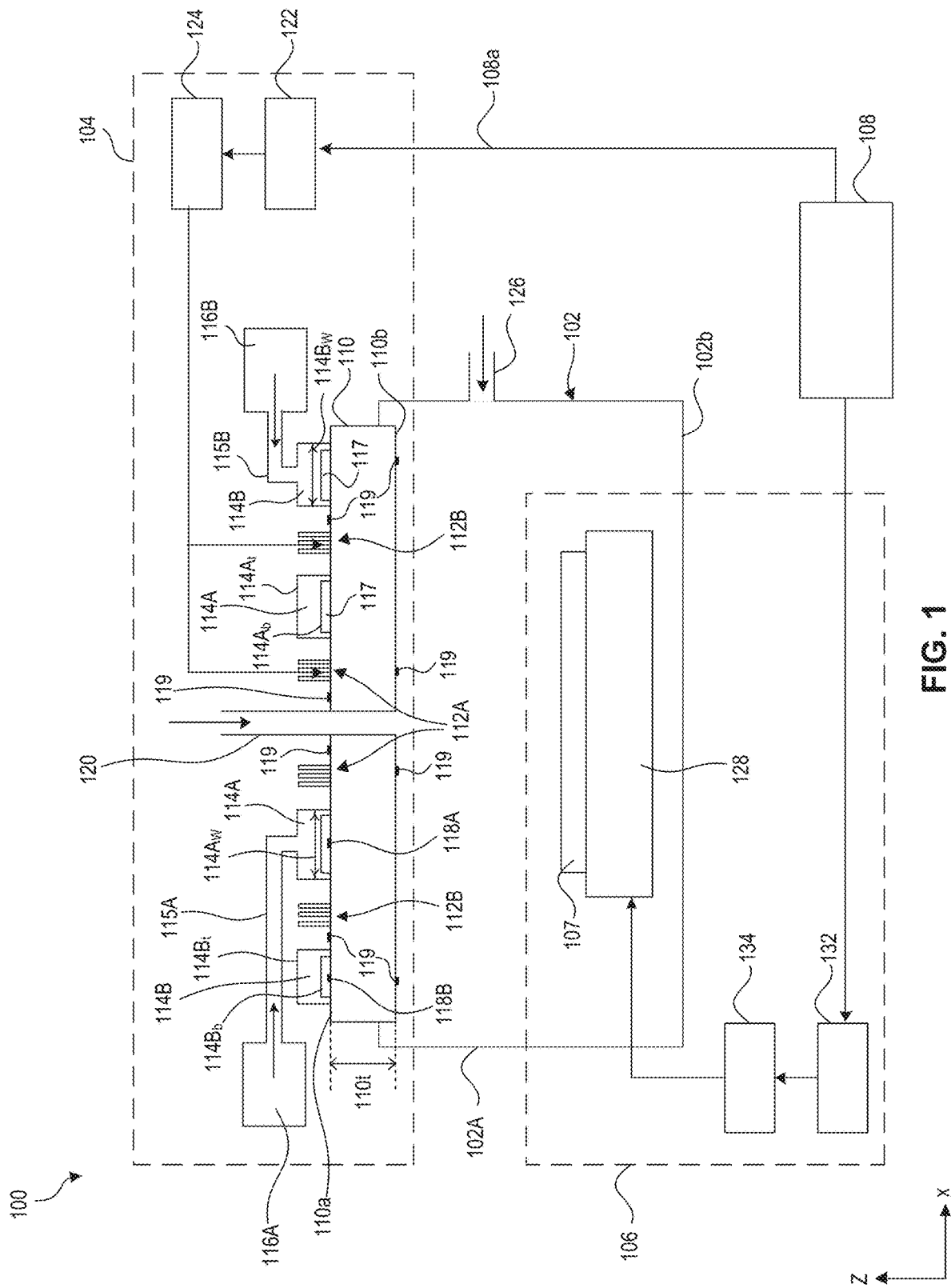
FIG. 1 illustrates a cross-sectional view of a semiconductor plasma processing system with a temperature-controlled plasma generation system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value).

Semiconductor wafers are subjected to different plasma processes (e.g., plasma etching and/or plasma enhanced deposition) in different plasma processing systems during the fabrication of semiconductor devices. The plasma processing systems provide temperature-controlled plasma processing chambers to prevent temperature dependent process drifts during wafer plasma processing to achieve wafer-to-wafer reproducibility for low manufacturing costs and high production yield of semiconductor devices.

In the plasma processing systems, the temperature dependent process drifts can occur due to temperature variations in plasma generation systems. As the plasma generation systems are positioned on the plasma processing chambers, temperature variations in the plasma generation systems can cause the properties of the plasma generated in the plasma processing chambers to vary, consequently causing variations in plasma process parameters (e.g., etch rate and/or deposition rate) associated with the processed wafers. For example, the temperature of a dielectric window of a plasma generation system can increase with increase in the number of plasma processed wafers. As the bottom surface of the dielectric window forms the top surface of the plasma processing chamber, the temperature variations in the dielectric window can induce variations in the chemical composition of the plasma generated in the plasma processing chamber. As a result, the plasma process parameters (e.g., etch rate and/or deposition rate) can vary between the wafers processed in the plasma processing chamber and poor wafer-to-wafer reproducibility.

The present disclosure provides example temperature-controlled plasma generation systems for plasma processing systems to prevent and/or mitigate temperature dependent process drifts during wafer plasma processing to achieve wafer plasma process repeatability. In some embodiments, a temperature-controlled plasma generation system can include a dielectric window and one or more gas distribution elements positioned on the dielectric window. The one or more gas distribution elements can be configured to distribute thermally conditioned gas on the dielectric window and regulate the temperature across the dielectric window to be substantially uniform and constant during wafer plasma processing.

In some embodiments, the one or more gas distribution elements can have ring-shaped tubular structures and a plurality of gas distribution holes configured to discharge thermally conditioned gas onto a top surface of the dielectric window. In some embodiments, different regions of the one or more gas distribution elements can have different sets of gas distribution holes. The dimension and density of each set of gas distribution holes can be different from each other. The sets of gas distribution holes can be designed and arranged to control the thermally conditioned gas amount discharged across the dielectric window to apply a substantially uniform amount of thermal energy across the dielectric window and regulate the dielectric window temperature to be substantially uniform during wafer plasma processing.

In some embodiments, the dielectric window with the one or more gas distribution elements can have temperature variations less than about 6° C. (e.g., about 0.5° C., about 1° C., about 3° C., or about 5° C.) during wafer plasma processing. In some embodiments, the temperature variations in the dielectric window with the one or more gas distribution elements can be reduced by a range of about 80% to about 95% (e.g., about 80%, about 85%, about 90%, or about 95%) compared to the temperature variations in dielectric windows without the one or more gas distribution elements during wafer plasma processing. As a result, temperature dependent variations in plasma process parameters (e.g., etch rate and/or deposition rate) between plasma processed wafers can be reduced and plasma process repeatability and wafer-to-wafer reproducibility can be achieved.

FIG. 1 illustrates a cross-sectional view of a semiconductor plasma processing system 100, according to some embodiments. In some embodiments, semiconductor plasma processing system 100 can include a plasma processing chamber 102, a temperature-controlled plasma generation system 104 (also referred to as "plasma generation system 104") positioned on plasma processing chamber 102, a wafer holder system 106 configured to hold a wafer 107 during plasma processing within plasma processing chamber 102, and a control system 108 configured to control one or more operations of plasma generation system 104 and wafer holder system 106. Plasma generation system 104 can be configured to generate plasma (not shown) within plasma processing chamber 102 for various plasma processes, such as etching or deposition.

In some embodiments, plasma generation system 104 can include a dielectric window 110, inductive coils 112A-112B and gas distribution elements 114A-114B on dielectric window 110, gas conditioning systems 116A-116B coupled to respective gas distribution elements 114A-114B, sensors 118A-118B on dielectric window 110 under respective gas distribution elements 114A-114B, a gas injector 120 coupled to plasma processing chamber 102 through dielectric window 110, and a radio frequency (RF) power supply 122 and a match network 124 coupled to inductive coils 112A-112B.

Plasma processing chamber 102 can be structurally defined by chamber sidewalls 102A, base 102B, and dielectric window 110. Bottom surface 110b of dielectric window 110 can form the top surface of plasma processing chamber 102. Chamber sidewalls and base 102A-102B can include stainless steel or aluminum and can be coated with yttrium oxide ($Y_2O_3$), yttrium fluoride (YF), cerium oxide ($CeO_2$), and/or other suitable plasma resistant coatings. In some embodiments, plasma processing chamber 102 can include a gas inlet port 126 configured to receive one or more process gases (e.g., etchant gas or precursor deposition gas) from a process gas source (not shown) for the plasma processes. The one or more process gases and byproducts can be removed from plasma processing chamber 102 through an outlet port (not shown) in base 102B of plasma processing chamber 102 and a pump (not shown), which also can serve to maintain a particular pressure within plasma processing chamber 102. In some embodiments, vacuum can be maintained in plasma processing chamber 102 during the plasma processing by a suitable vacuum pump apparatus (not shown) coupled to the outlet port.

Dielectric window 110 can include a dielectric material, such as ceramic, quartz, aluminum oxide ($Al_2O_3$), aluminum nitride (AlN), aluminum carbide (AlC), silicon (Si), silicon carbide (SiC), silicon nitride (SiN), or a combination thereof. In some embodiments, dielectric window 110 can have a vertical dimension $110t$ (e.g., thickness) along a Z-axis ranging from about 2 cm to about 6 cm (e.g., about 2 cm, about 3 cm, about 4 cm, about 5 cm, or about 6 cm).

Inductive coils 112A-112B can each be positioned spirally around gas injector 120 on dielectric window 110. Even though two inductive coils are shown in FIG. 1, plasma generation system 104 can have any number of inductive coils. Inductive coils 112A-112B can include electrically conductive materials similar to or different from each other. Even though FIG. 1 shows each of inductive coils 112A-112B to have three turns, each inductive coil can have any number of turns. Each of inductive coils 112A-112B can be coupled to RF power supply 122 via match network 124. RF power supply 122 can be configured to supply RF current to inductive coils 112A-112B to create inductively coupled RF plasma in plasma processing chamber 102. The RF current flowing through inductive coils 112A-112B can generate an electromagnetic field about inductive coils 112A-112B. The electromagnetic field can generate an inductive current within plasma processing chamber 102. The inductive current can act on a plasma generating gas introduced into plasma processing chamber 102 through gas injector 120 to generate the inductively coupled RF plasma. RF power supply 124 can be configured to supply the RF power in a range of about 50 W to about 5000 W. In some embodiments, control system 108 can be configured to detect the mode of plasma generation based on the operation of the gas supply system (not shown) providing plasma generating gas through gas injector 120. Plasma generation can be considered to be active when the gas supply system is in operation and can be considered to be terminated when the gas supply is off. In some embodiment, wafer 107 can be transferred out of plasma processing chamber 102 in response to control system 108 indicating the termination of the plasma generation.

In some embodiments, match network 124 can be configured to tune the RF power supplied to inductive coils 112A-112B. The RF power supplied to inner inductive coil 112A can be equal to or different from the RF power supplied to outer inductive coil 112B. The RF power supplied to inductive coils 112A-112B can be tuned to control the plasma density in a radial distribution over the wafers processed in plasma processing chamber 102. In some embodiments, the RF power supplied to inductive coils 112A-112B can be tuned based on the processing parameters (e.g., etch rate or deposition rate) defined during the plasma processes. In some embodiments, match network 124 can be coupled to control system 108 and configured to operate based on control signals 108 received from control system 108.

Gas distribution elements 114A-114B can be configured to receive thermally conditioned gas (e.g., air, an inert gas, or a combination thereof) from gas conditioning systems 116A-116B, respectively and to discharge the thermally conditioned gas on dielectric window 110. The thermally conditioned gas can help regulate the temperature across one or more surfaces (e.g., top surface 110a and/or bottom surface 110b) of dielectric window 110 to be substantially uniform and maintain the temperature at a value in the range of about 80° C. to about 110° C. (e.g., about 80° C., about 90° C., or about 100° C.) during wafer plasma processing in plasma processing chamber 102. In some embodiments, dielectric window 110 can have temperature variations less than about 6° C. (e.g., about 0.5° C., about 1° C., about 3° C., or about 5° C.) during wafer plasma processing. As a result, variations induced in the chemical composition of the generated plasma in plasma processing chamber 102 due to dielectric window temperature variations can be substantially mitigated compared to plasma generation systems without gas distribution elements and achieve substantially constant plasma process parameters (e.g., etch rate and/or deposition rate) during wafer plasma processing.

Figure 2:
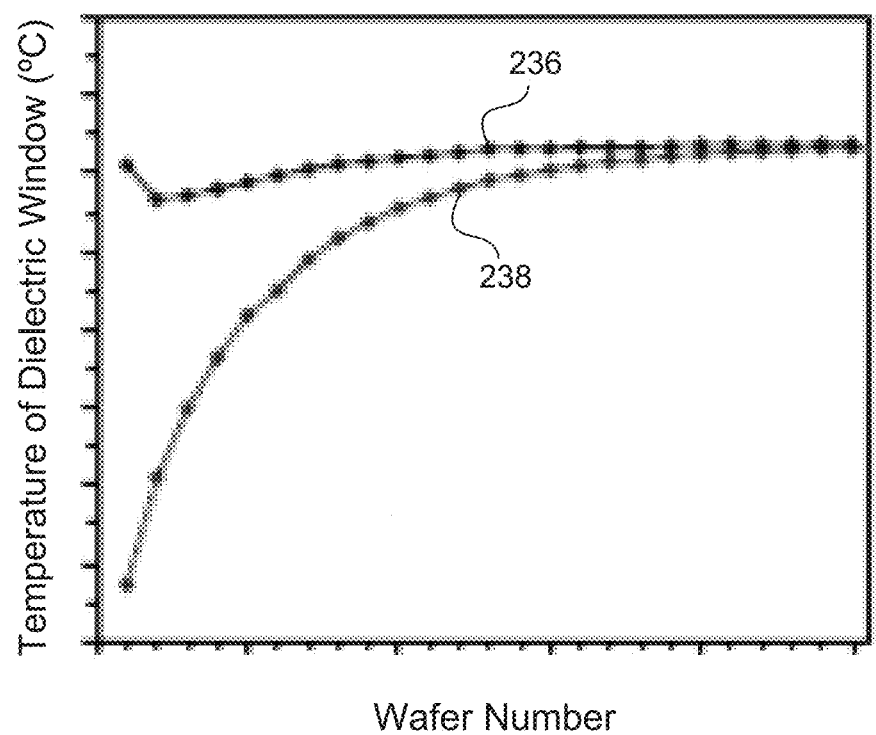
FIG. 2 is a graph illustrating temperature uniformity of a dielectric window of a temperature-controlled plasma generation system, in accordance with some embodiments.

Compared to plasma generation systems without gas distribution elements 114A-114B on dielectric windows, temperature variations in dielectric window 110 can be reduced by a range of about 80% to about 95% (e.g., about 80%, about 85%, about 90%, or about 95%) during wafer plasma processing. FIG. 2 illustrates an example of such comparison between plasma processing systems with and without gas distribution elements similar to gas distribution elements 114A-114B on dielectric windows. FIG. 2 shows plots 236 and 238 of dielectric window temperatures during sequential plasma processing of a series of wafers with respect to the wafer number in the series of wafers. Plots 236 and 238 represent dielectric windows of plasma processing systems with and without gas distribution elements, respectively. Comparison of plots 236 and 238 shows a substantially constant dielectric window temperature for the system with gas distribution elements, whereas the dielectric window temperature increases with increase in the number of wafers for the system without gas distribution elements.

Referring back to FIG. 1, in some embodiments, gas distribution elements 114A-114B can be ring-shaped tubes and can be positioned on dielectric window 110 in an alternating configuration with inductive coils 112A-112B around gas injector 120 as shown in FIG. 1. Gas distribution elements 114A-114B can have cross-sections of any geometric shape (e.g., rectangular, circular, elliptical, or polygonal) along their diameters.

Gas distribution elements 114A-114B can be laterally spaced apart from each other, from inductive coils 112A-112B, and from gas injector 120. In some embodiments, bottom surfaces 114Ab-114Bb of gas distribution elements 114A-114B can be vertically spaced apart from dielectric window 110 to create gaps 117 and allow thermally conditioned gas to be discharged from gas distribution holes (not shown in FIG. 1; shown in FIGS. 4, 6, and 7A-9A) in bottom surfaces 114Ab-114Bb. Gaps 117 can each have a vertical dimension along a Z-axis ranging from about 1 mm to about 100 mm (e.g., about 1.5 mm, about 5 mm, about 10 mm, about 20 mm, or about 50 mm).

In some embodiments, instead of the alternating configuration of FIG. 1, both gas distribution elements 114A-114B can be positioned between inductive coils 112A-112B, between gas injection 120 and inner inductive coil 112A, or around outer inductive coil 112B. In some embodiments, horizontal dimensions $114A_w$-$114B_w$ of gas distribution elements 114A-114B, respectively, along an X-axis can be equal to or different from each other. In some embodiments, horizontal dimensions $114A_w$-$114B_w$ can range from about 10 mm to about 40 mm (e.g., about 10 mm, about 20 mm, about 30 mm, or about 40 mm).

Gas conditioning systems 116A-116B can be coupled to gas distribution elements 114A-114B through gas inlet pipes 115A-115B, respectively. Gas inlet pipes 115A-115B can be coupled to top surfaces 114At-114Bt of gas distribution elements 114A-114B, respectively, through openings on top surfaces 114At-114Bt. Gas conditioning systems 116A-116B can be configured to receive a gas (e.g., air or inert gas), thermally condition (e.g., heat or cool) the gas, and supply the thermally conditioned gas to gas distribution elements 114A-114B through gas inlet pipes 115A-115B, respectively. In some embodiments, gas conditioning systems 116A-116B can be configured to control the flow rate of the thermally conditioned gas supplied to gas distribution elements 114A-114B.

In some embodiments, gas conditioning systems 116A-116B can be configured to supply the thermally conditioned gas at a substantially constant temperature ranging from about 70° C. to about 120° C. (e.g., about 70° C., about 80° C., about 90° C., about 100° C., about 110° C., or about 120° C.) during wafer plasma processing. In some embodiments, gas conditioning systems 116A-116B can be configured to supply the thermally conditioned gas at different temperatures ranging from about 70° C. to about 120° C. (e.g., about 70° C., about 80° C., about 90° C., about 100° C., about 110° C., or about 120° C.) during wafer plasma processing. Gas conditioning systems 116A-116B can be configured to dynamically adjust the temperature of the thermally conditioned gas supplied to gas distribution elements 114A-114B during the plasma processing. The dynamic adjustment can be performed based on control signals (not shown) received by gas conditioning systems 116A-116B from control system 108. These control signals can be generated by control system 108 based on the temperatures of dielectric window 110 and/or discharged gas from gas distribution elements 114A-114B. The temperature of the discharged gas from gas distribution elements 114A-114B can be measured using sensors 118A-118B, respectively. Sensors 118A-118B can be placed on dielectric window 110 within gaps 117. Even though two sensors shown in FIG. 1, any number of sensors similar to sensors 118A-118B can be placed on dielectric window 110 within gaps 117. The temperature of dielectric window 110 can be measured using sensors 118A-118B and/or 119. Any number of sensors similar to sensors 119 can be placed on dielectric window 110.

Wafer holder system 106 can include a chuck 128 positioned within plasma processing chamber 102 and configured to hold wafer 107 during the plasma processing. Chuck 128 can include an electrostatic chuck. In some embodiments, chuck 128 can include electrostatic electrodes (not shown) configured to apply clamping voltage to chuck 128 for electrostatically clamping wafer 107 to chuck 107. Chuck 128 can be electrically charged using an RF power supply 132 coupled to chuck 128 through match network 134. RF power supply 132 can be tuned by match network 134 to supply power to the electrostatic electrodes. In some embodiments, the operations of RF power supply 132 can be controlled by control system 108.

In addition, semiconductor plasma processing system 100 can include other structural and functional components, such as RF generators, matching circuits, chamber liners, control circuits, actuators, power supplies, exhaust systems, etc. which are not shown for simplicity.

Figure 3A:
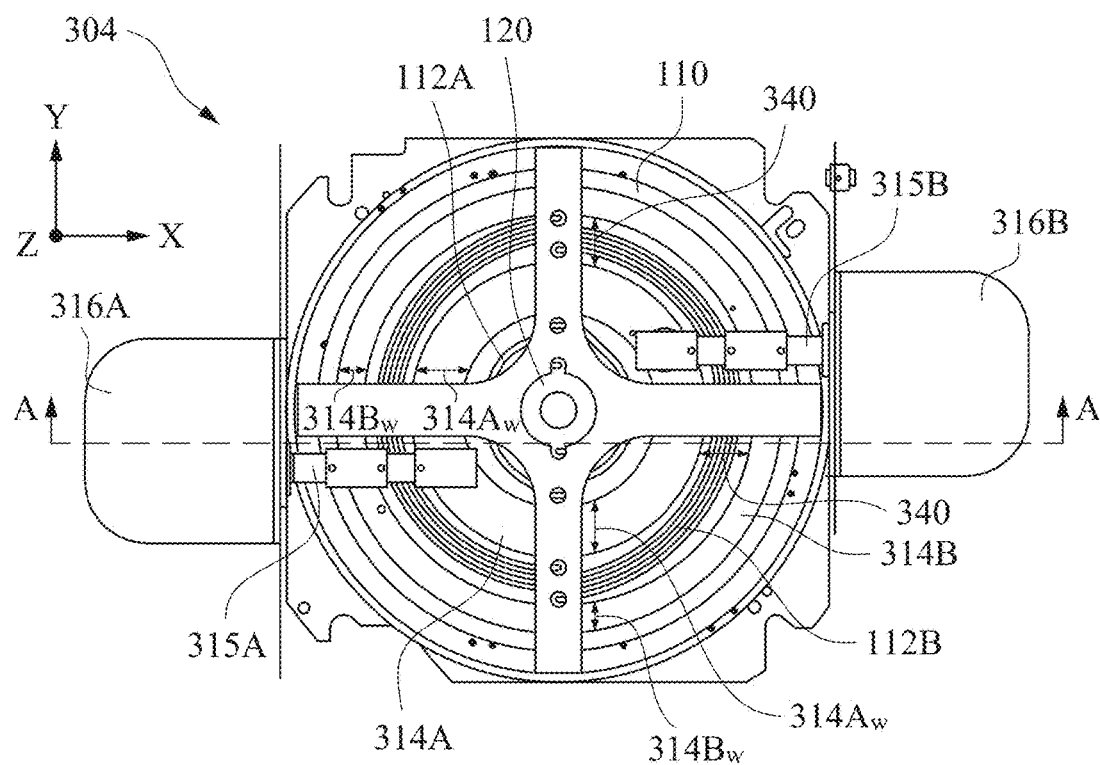
FIGS. 3A-3B illustrate a top view and a cross-sectional view, respectively, of a temperature-controlled plasma generation system, in accordance with some embodiments.
Figure 3B:
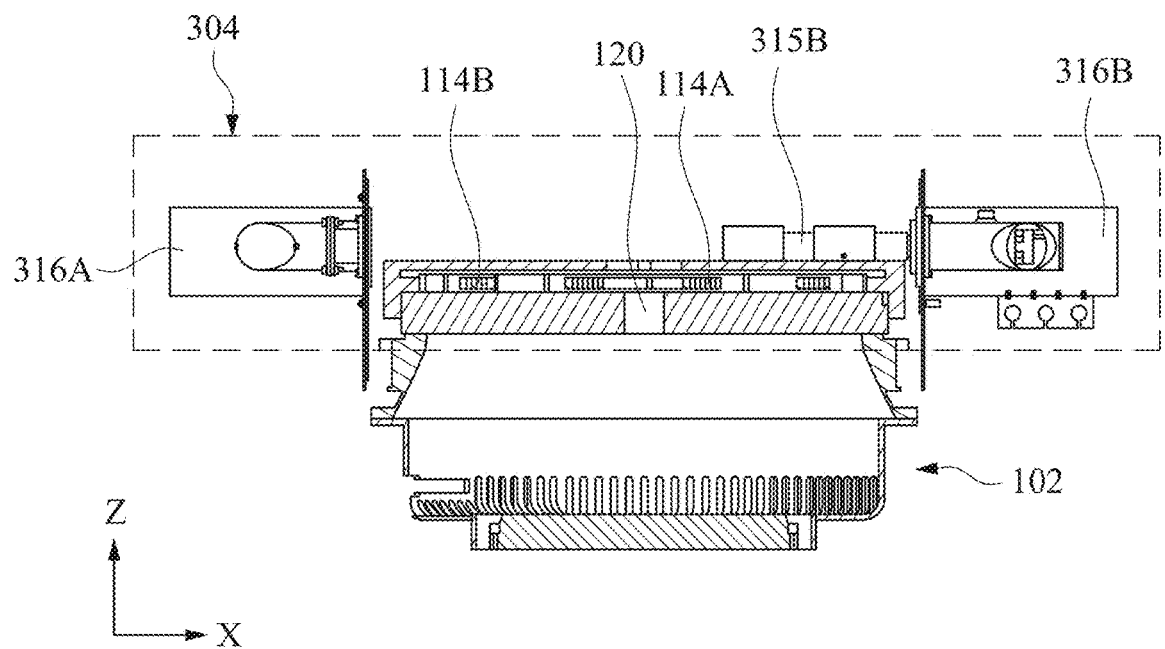

FIG. 3A shows a top view of a temperature-controlled plasma generation system 304 (also referred to as "plasma generation system 304) and FIG. 3B shows a cross-sectional view of plasma generation system 304 along line A-A of FIG. 3A, according to some embodiments. Elements in FIGS. 3A-3B with the same annotations as elements in FIG. 1 are described above. The above discussion of plasma generation system 104 applies to plasma generation system 304 unless mentioned otherwise.

Plasma generation system 304 can be positioned on plasma processing chamber 102 (partial structure shown in FIG. 3B). Plasma generation system 304 can include dielectric window 110, inductive coils 112A-112B and gas distribution elements 314A-314B on dielectric window 110, gas conditioning systems 316A-316B each coupled to gas distribution elements 314A-314B, gas inlet pipes 315A-315 coupled to gas distribution elements 314A-314B and gas conditioning systems 316A-316B, and gas injector 120 coupled to plasma processing chamber 102 through dielectric window 110.

The above discussion of gas distribution elements 114A-114B, gas conditioning systems 116A-116B, and gas inlet pipes 115A-115B applies to gas distribution elements 314A-314B, gas conditioning systems 316A-316B, and gas inlet pipes 315A-115B, respectively, unless mentioned otherwise. Plasma generation system 304 can further include other structural and functional components similar to plasma generation system 104, such as sensors 118A-118B, RF power supply 122, and match network 124, which are not shown in FIGS. 3A-3B for simplicity.

In some embodiments, dielectric window 110 can be circular in shape and have a diameter ranging from about 45 cm to about 60 cm (e.g., about 45 cm, about 50 cm, or about 55 cm). Gas distribution elements 314A-314B can be ring-shaped tubes placed around gas injector 120 in an alternating configuration with inductive coils 112A-112B on dielectric window. In some embodiments, inner gas distribution element 314A can have an outer diameter ranging from about 240 mm to about 270 mm (e.g., about 250 mm, about 256 mm, about 265 mm, or about 270 mm) and outer gas distribution element 314B can have an outer diameter ranging from about 440 mm to about 470 mm (e.g., about 450 mm, about 456 mm, about 465 mm, or about 470 mm). Diameter of outer gas distribution element 314B can be smaller than the diameter of dielectric window 110, in some embodiments.

In some embodiments, horizontal dimensions $314A_w$-$314B_w$ of gas distribution elements 314A-314B, respectively, along an X-axis or a Y-axis can be equal to or different from each other. In some embodiments, horizontal dimensions $314A_w$-$314B_w$ can range from about 10 mm to about 40 mm (e.g., about 10 mm, about 20 mm, about 30 mm, or about 40 mm). In some embodiments, gas distribution elements 314A-314B can be spaced apart from each other along an X- or a Y-axis by a lateral distance 340 ranging from about 60 mm to about 90 mm (e.g., about 60 mm, about 70 mm, or about 90 mm) to prevent contact with each other and/or with outer inductive coil 114B. Lateral distance 340 can depend on horizontal dimensions $314A_w$-$314B_w$ and the size of outer inductive coil 114B.

Each of gas distribution elements 314A-314B can be configured to receive thermally conditioned gas from gas conditioning systems 316A-316B through gas inlet pipes 315A-315B, respectively. Gas conditioning system 316A can be configured to supply thermally conditioned gas to gas distribution elements 314A-314B through gas inlet pipe 315A, and gas conditioning system 316B can be configured to supply thermally conditioned gas to gas distribution elements 314A-314B through gas inlet pipe 315A. Thus, each of gas distribution elements 314A-314B can receive thermally conditioned gas at two different inlet ports (not shown), which are the inlet ports to which gas inlet pipes 315A-315B are coupled to each of gas distribution elements 314A-314B. The two inlet ports of each gas distribution elements 314A-314B can be about 180 degrees radially apart from each other and help to provide a substantially uniform distribution of thermally conditioned gas with gas distribution elements 314A-314B.

The arrows on gas distribution elements 314A-314B moving radially around a Z-axis indicate the flow of thermally conditioned gas through gas distribution elements 314A-314B after being supplied through gas inlet pipes 315A-315B. The arrows extending away from gas distribution elements 314A-314B indicate the flow of thermally conditioned gas after being discharged from gas distribution elements 314A-314B through their gas distribution holes on their base plates (not shown in FIG. 1; shown in FIGS. 6 and 8-9).

FIG. 4 shows an isometric view of a temperature-controlled plasma generation system 404 (also referred to as "plasma generation system 404"), according to some embodiments. Elements in FIG. 4 with the same annotations as elements in FIG. 1 are described above. The above discussion of plasma generation system 104 applies to plasma generation system 404 unless mentioned otherwise. Plasma generation system 404 can include a chamber 442, dielectric window 110 and gas distribution elements 114A-114B within chamber 442, gas conditioning systems 116A-116B coupled to respective gas distribution elements 114A-114B, and gas inlet pipes 115A-115 coupled to gas distribution elements 114A-114B and gas conditioning systems 116A-116B. Plasma generation system 404 can further include other structural and functional components similar to plasma generation system 104, such as inductive coils 112A-112B, gas injector 120, sensors 118A-118B, RF power supply 122, and match network 124, which are not shown in FIG. 4 for simplicity.

Chamber 442 can include gas inlet and outlet ports 444A-444B on its sidewalls 442A-442B (ports 444A-444B on sidewall 442A not visible in FIG. 4). Gas inlet ports 444A can be used to couple gas inlet pipes 115A-115B to gas conditioning systems 116A-116B, respectively. Gas outlet port 444B can be used to extract all or portions of gas discharged by gas distribution elements 114A-114B on dielectric window 110 within chamber 442. Gas conditioning systems 116A-116B can be configured to receive all or portions of the gas discharged within chamber 442 through gas outlet ports 444B, thermally recondition the gas, and redistribute the gas on dielectric window 110 through gas distribution elements 114A-114B.

Gas conditioning system 116B is further described with reference to FIGS. 5A-5B, which show isometric views of gas conditioning system 116B with and without a housing 546, respectively, according to some embodiments. Gas conditioning system 116B can include housing 546 with openings 548A-548B and a gas inlet port 556. Housing 546 can be coupled to sidewall 442B of chamber 442 (FIG. 4) with openings 548A-548B aligned with ports 444A-444B (FIG. 4), respectively.

Referring back to FIGS. 5A-5B, gas conditioning system 116B can further include gas tubes 550A-550B, a thermal conditioning apparatus 552, a gas circulation system 554, and a gas inlet port 558 within housing 546. Gas tubes 550A-550B can be coupled to housing 546 with openings 548A-548B aligned with gas tube openings 560A-560B, respectively, and gas inlet port 556 aligned with gas inlet port 558. Gas conditioning system 116A can also include elements similar to gas conditioning system 116B.

Gas to be thermally conditioned within gas conditioning system 116B can be received by gas tube 550B through gas inlet ports 556 and 558 and/or through gas tube opening 560B. Gas received through gas tube opening 560B can be the all or portions of gas extracted from chamber 442 through gas outlet port 444B, which can be aligned to openings 548B and 560B. Gas circulation system 554 coupled to gas tubes 550A-550B can be configured to draw the gas from gas tube 550B, direct it through gas tube 550A for thermal conditioning, and discharge the thermally conditioned gas through openings 560A and 548A. In some embodiments, gas circulation system 554 can include a suction fan configured to draw the gas and/or a blower for directing the gas. Thermal conditioning apparatus 552 disposed within gas tube 550A can be configured to thermally condition (e.g., heat or cool) the gas received from gas tube 550B. In some embodiments, thermal conditioning apparatus 552 can include a heating coil configured to heat the gas and/or a fan configured to cool the gas within gas tube 550A. In some embodiments, gas conditioning systems 116A-116B can represent gas conditioning systems 316A-316B, respectively.

Figure 6:
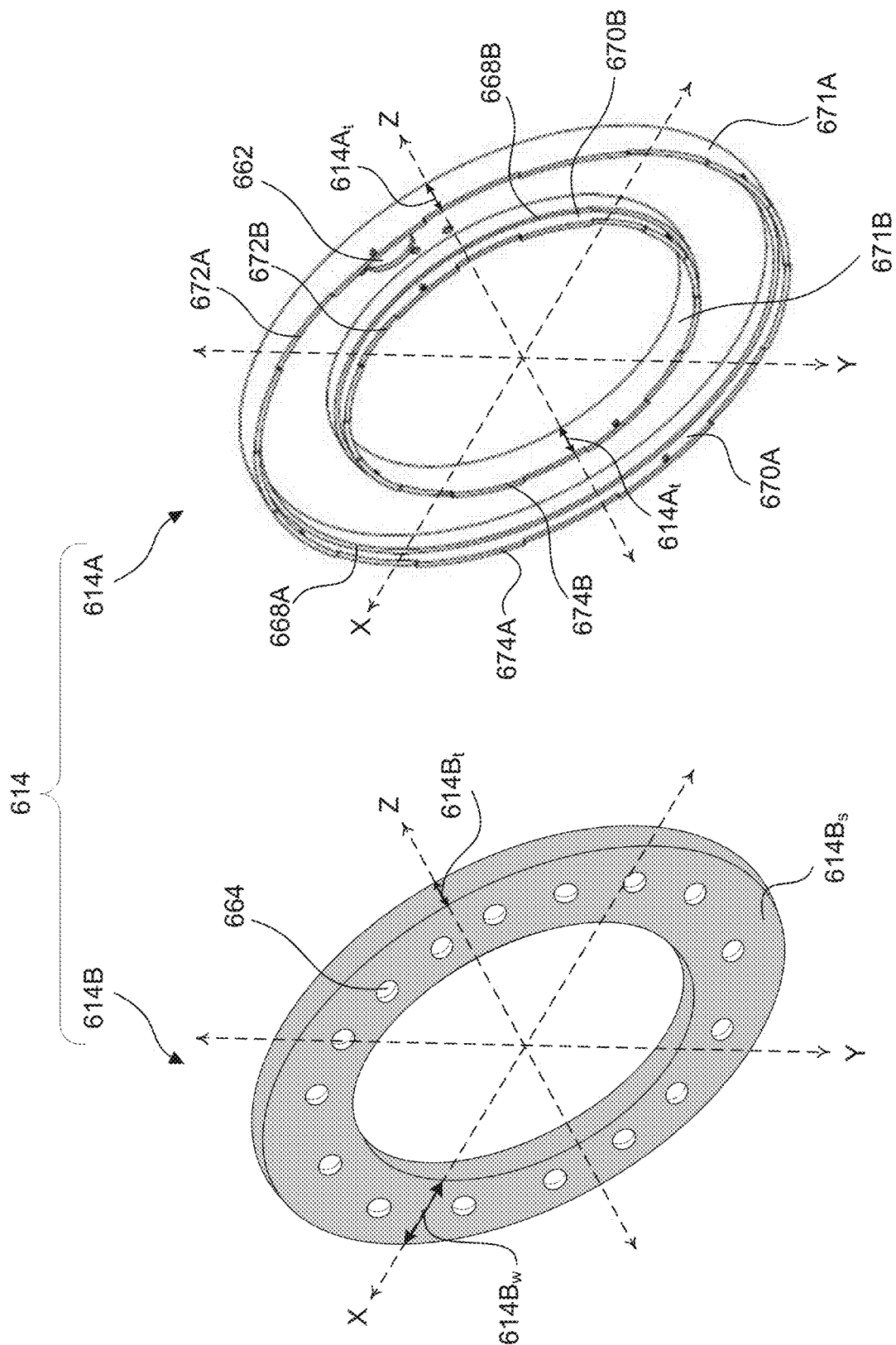
FIG. 6 illustrates an exploded isometric view of a gas distribution element of a temperature-controlled plasma generation system, in accordance with some embodiments.
Figure 7:
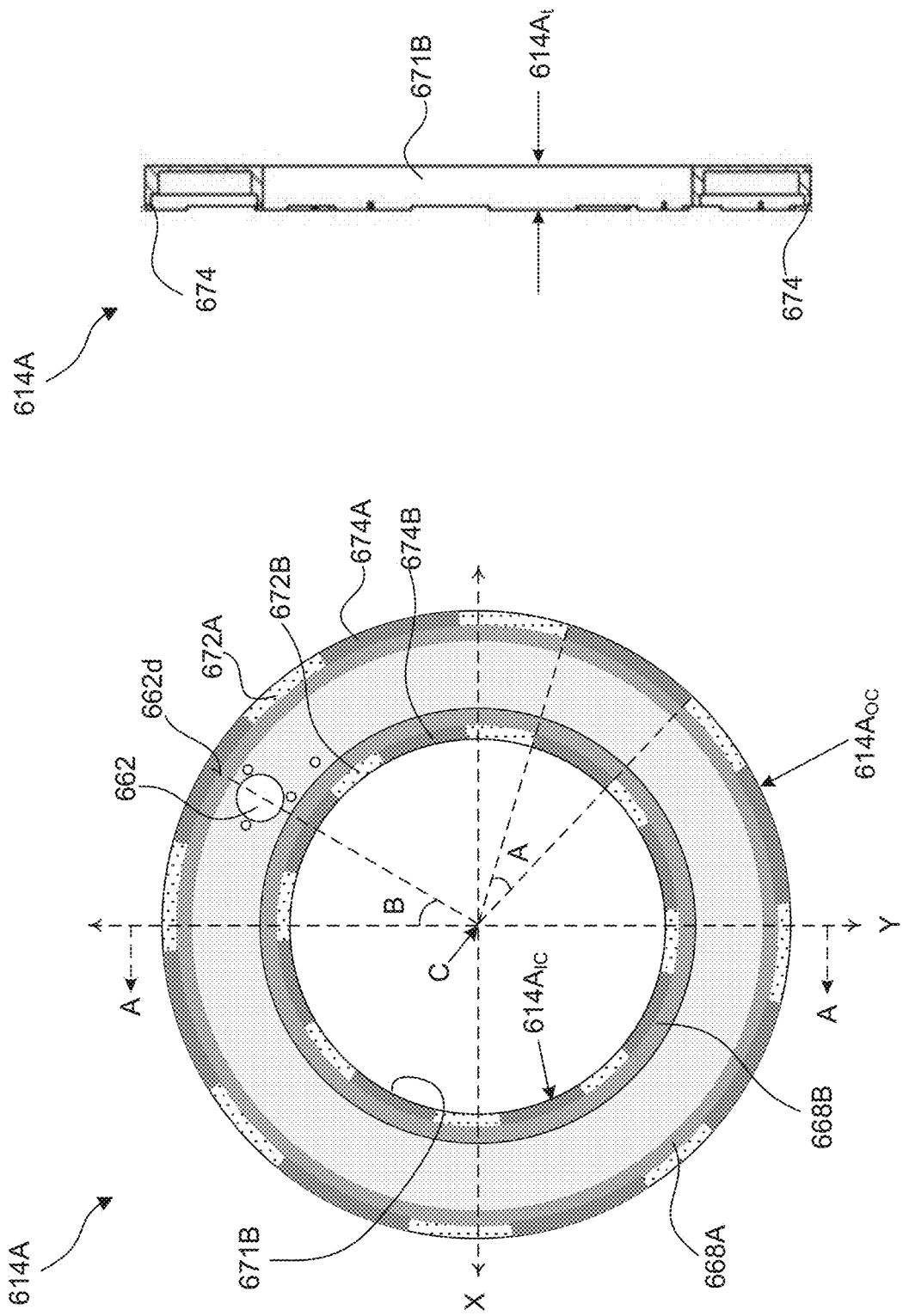
FIGS. 7A-7B illustrate a back side view and a cross-sectional view, respectively, of a cover plate of a gas distribution element of a temperature-controlled plasma generation system, in accordance with some embodiments.

FIG. 6 shows an exploded view of a gas distribution element 614, according to some embodiments. Gas distribution element 614 can represent gas distribution elements 114A, 114B, 314A, and/or 314B discussed above with reference to FIGS. 1, 3A, and 4. In some embodiments, gas distribution element 614 can be ring-shaped and can include a cover plate 614A with a gas inlet port 662 and a base plate 614B with gas distribution holes 664. Gas inlet port 662 can be coupled to a gas inlet pipe 115A, 115B, 315A, and/or 315B (not shown in FIG. 6; shown in FIGS. 1, 3A, and 4). Cover plate 614A can have more than one gas inlet port. Gas distribution holes 664 can allow thermally conditioned gas within gas distribution element 614 to be discharged and distributed on dielectric window 110 (not shown in FIG. 6; shown in FIGS. 1, 3A, and 4). In some embodiments, gas distribution holes 664 can have dimensions similar to or different from each other. In some embodiments, gas distribution holes can have a circular shape as shown in FIG. 6 or can be any geometric shape (e.g., rectangular, elliptical, or polygonal).

In an assembled form of gas distribution element 614, base plate 614B can be disposed on extended regions 668A-668B along interior sidewalls 670A-670B of cover plate 614A. In some embodiments, in the assembled form, the top surfaces of recessed rim portions 672A-672B of cover plate 614A can be substantially coplanar with back surface $614B_s$ of base plate 614B and the top surfaces of protruding rim portions 674A-674B of cover plate 614A can extend above back surface $614B_s$ along a negative Z-axis direction. Protruding rim portions 674 can be configured to support gas distribution element 614 on a dielectric window (e.g., dielectric window 110) such that gaps (e.g., gaps 117) between base plate 614B and the dielectric window can be created to allow thermally conditioned gas to be discharged from gas distribution holes 664 as described with reference to FIG. 1.

In some embodiments, exterior sidewalls 671A-671B of cover plate 614A can have a dimension $614A_t$ (e.g., thickness) along its Z-axis ranging from about 15 mm to about 25 mm (e.g., about 15 mm, about 20 mm, or about 25 mm). In some embodiments, base plate 614B can have a dimension $614B_w$ (e.g., width) along an X-axis ranging from about 10 mm to about 50 mm (e.g., about 10 mm, about 20 mm, about 30 mm, or about 40 mm). The X-axes and Y-axes of FIG. 6 can be along the diameters of cover plate 614A and base plate 614B. In some embodiments, base plate 614B can have a dimension $614B_t$ (e.g., thickness) along a Z-axis ranging from about 1 mm to about 5 mm (e.g., about 1 mm, about 2 mm, about 3 mm, or about 4 mm).

Cover plate 614A is further described with FIGS. 7A-7B, which shows a back side view of cover plate 614A and a cross-sectional view of cover plate 614A along line A-A of FIG. 7A. Elements in FIGS. 7A-7B with the same annotations as elements in FIG. 6 are described above. Different regions of cover plate 614A have been provided with different shading for illustration purposes. For example, the dotted regions represent recessed rim portions 672A-672B and dark grey regions adjacent to dotted regions represent protruding rim portions 674A-674B discussed above with reference to FIG. 6. Rim portions 672A and 674A can have arc shapes along outer circumference $614_{OC}$ of cover plate 614 and rim portions 674A and 674B can have arc shapes along inner circumference $614_{IC}$ of cover plate 614.

In some embodiments, an angle A ranging from about 20 degrees to about 30 degrees (e.g., about 20 degrees, about 24 degrees, or about 28 degrees) can be subtended by each of arc-shaped protruding rim portions 674A-674B at center C of outer and inner circumferences $614_{OC}$ and $614_{IC}$. In some embodiments, gas inlet port 662 can have a circular shape and a diameter line 662d of circular-shaped gas inlet port 662 can form an angle B ranging from about 20 degrees to about 40 degrees (e.g., about 20 degrees, about 30 degrees, or about 40 degrees) with a diameter line of cover plate 614 along a Y-axis.

Figure 8:
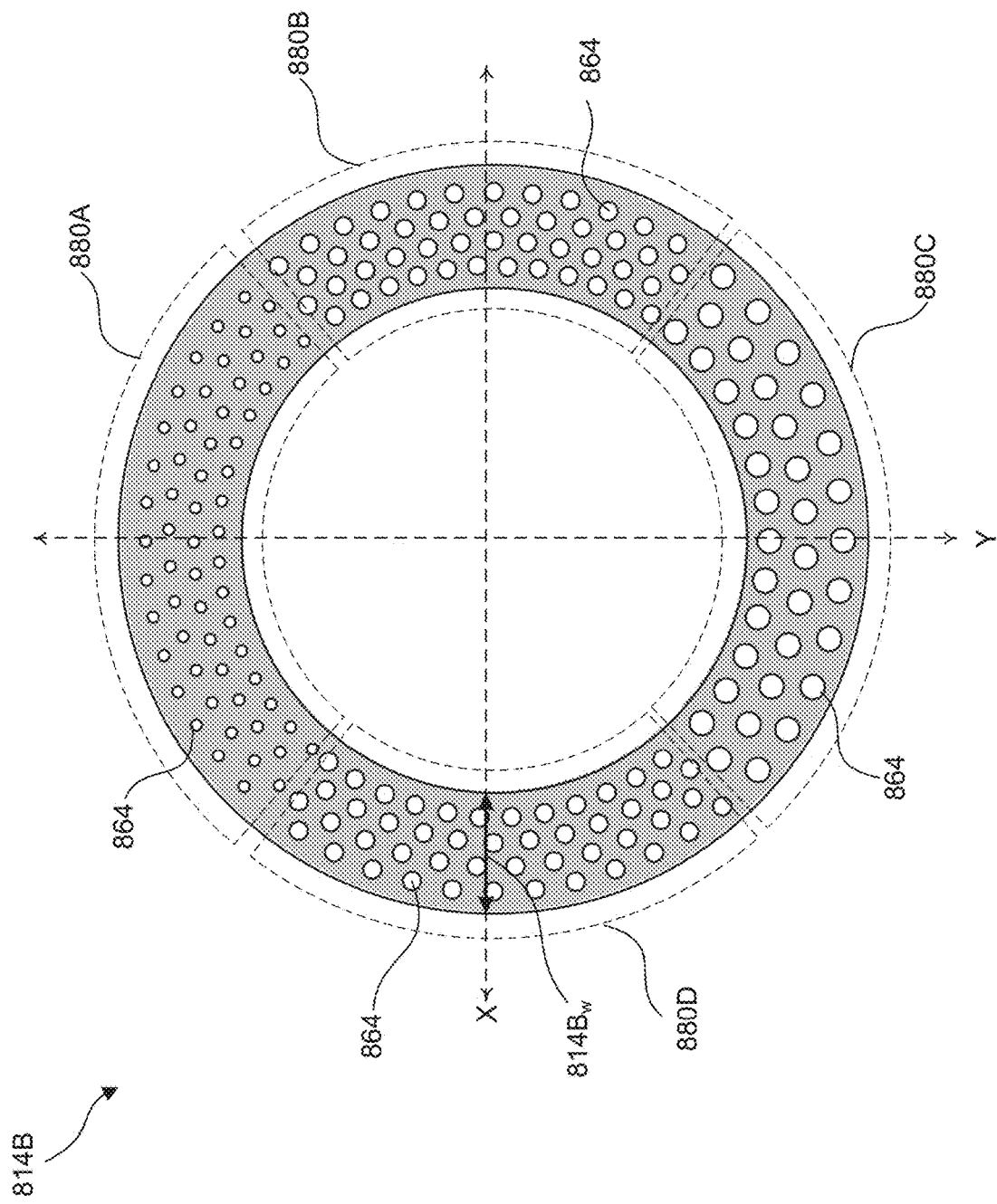
FIGS. 8-9 illustrate back side views of a base plate of a gas distribution element of a temperature-controlled plasma generation system, in accordance with some embodiments.

FIG. 8 shows a back side view of a base plate 814B of a gas distribution element with gas distribution holes 864, according to some embodiments. The above discussion of base plate 614B and gas distribution holes 664 applies to base plate 814B and gas distribution holes 864, respectively, unless mentioned otherwise. Base plate 814B can have different regions with different sized gas distribution holes 864. In some embodiments, base plate 814B can have four regions with four sets 880A-880D of gas distribution holes 864. In some embodiments, each of four sets 880A-880D can have gas distribution holes 864 with dimensions different from the other sets. In some embodiments, gas distribution holes 864 can each have dimensions substantially equal to or different from each other in the same set of set 880A, 880B, 880C, and/or 880D. In some embodiments, gas distribution holes 864 of set 880A can have the smallest dimensions compared to sets 880B-880D and gas distribution holes 864 of set 880C can have the largest dimensions compared to sets 880A-880B and 880D.

In some embodiments, gas distribution holes 864 of set 880A can each have a diameter ranging from about 1 mm to about 5 mm (e.g., about 1 mm, about 2 mm, about 3 mm, or about 4 mm). In some embodiments, gas distribution holes 864 of set 880C can each have a diameter ranging from about 8 mm to about 15 mm (e.g., about 8 mm, about 10 mm, about 12 mm, or about 15 mm). In some embodiments, gas distribution holes 864 of sets 880B and 880D can each have a diameter ranging from about 4 mm to about 8 mm (e.g., about 4 mm, about 6 mm, or about 8 mm). In some embodiments, gas distribution holes 864 of sets 880B and 880D can have dimensions equal to or different from each other. In some embodiments, the number of gas distribution holes 864 in each of sets 880A-880D can be equal to or different from each other. In some embodiments, base plate 814B can have a horizontal dimension $814B_w$ (e.g., width) along an X-axis ranging from about 30 mm to about 50 mm (e.g., about 30 mm, about 35 mm, about 40 mm, or about 45 mm).

The arrangements and dimensions of gas distribution holes 864 in base plate 814B can be configured to control the volume of thermally conditioned gas discharged from different regions of a gas distribution element (e.g., gas distribution elements 114A-114B). The volume discharged from the different regions can be varied to compensate for variations in temperature of the thermally conditioned gas within the gas distribution element and consequently, provide a substantially uniform amount of thermal energy (hot or cold) from the discharged volume across a dielectric window (e.g., dielectric window 110). The temperature of thermally conditioned gas in regions of the gas distribution element near a gas inlet port (e.g., gas inlet port 662) can be higher (e.g., heated gas) or lower (e.g., cooling gas) than that in regions of the gas distribution element farther away from the gas inlet port. This temperature variation can be due to heat loss or heat gain by the thermally conditioned gas when circulating within the gas distribution element.

To compensate for the temperature variations and provide the substantially uniform amount of thermal energy across the dielectric window, the discharged volume of the thermally conditioned gas can be increased as the distance of the discharging region from the gas inlet port increases. The discharging region can be a region of the gas distribution element from where the thermally conditioned gas is discharged. The temperature variations can be compensated when the gas distribution element can have gas distribution holes 864 with the smallest dimensions (e.g., set 880A) positioned under or closer to the gas inlet port compared to larger gas distribution holes 864 (e.g., sets 880B-880D). In this position of base plate 814B with respect to the gas inlet port, gas distribution holes 864 of sets 880B and 880D with larger dimensions can be farther away from the gas inlet port and gas distribution holes 864 of set 880C with the largest dimensions can be farthest away from the gas inlet port. As a result, the smallest volume of the thermally conditioned gas can be discharged from gas distribution element regions near the gas inlet port, larger volumes can be discharged from regions farther away from the gas inlet port, and the largest volume can be discharged from regions farthest away from the gas inlet port. The variation in the dimensions of gas distribution holes 864 can depend on the variation of the thermally conditioned gas within the gas distribution element.

Figure 9:
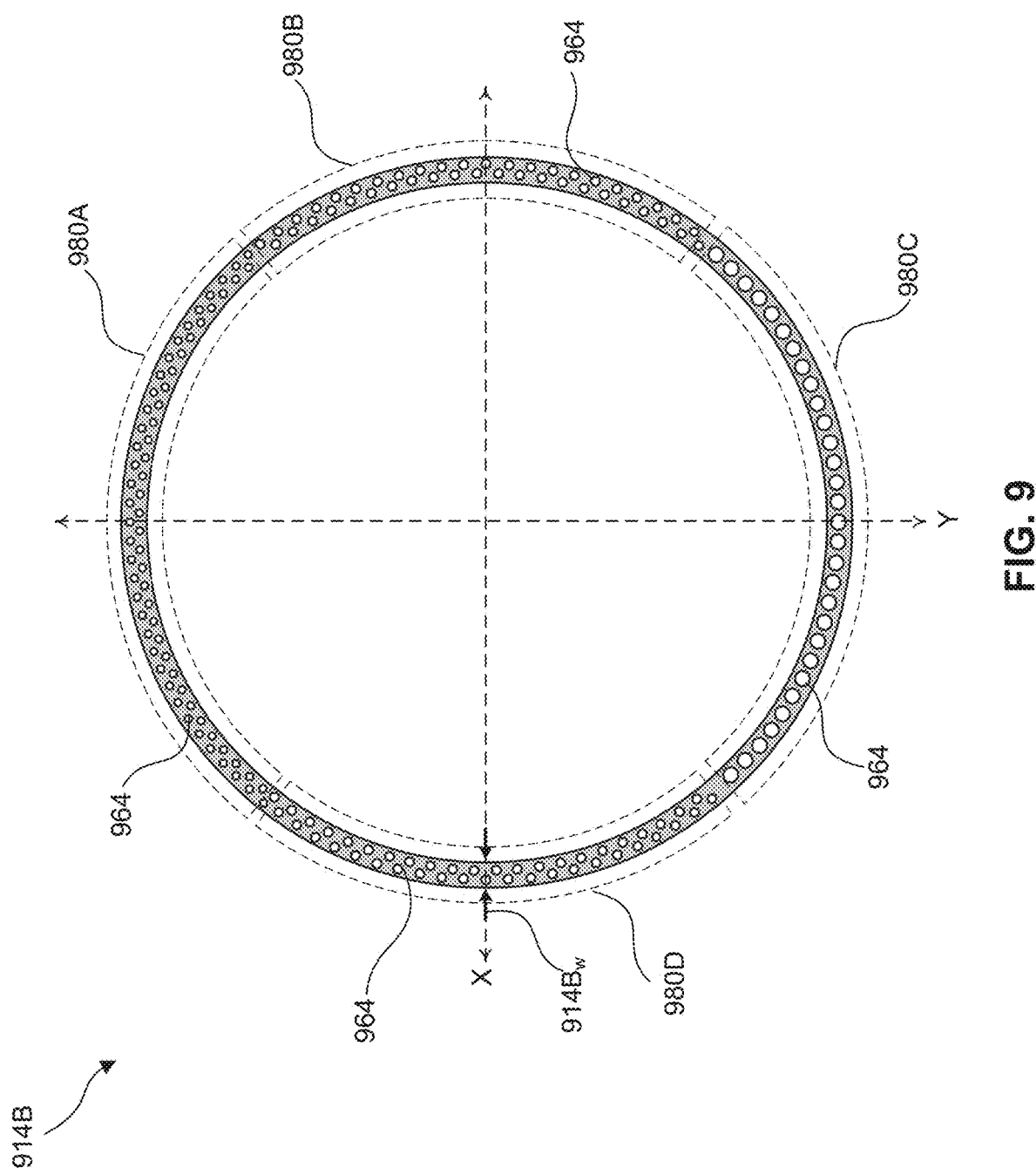

FIG. 9 shows a back side view of a base plate 914B of a gas distribution element with gas distribution holes 964, according to some embodiments. The above discussion of base plate 614B and gas distribution holes 664 applies to base plate 914B and gas distribution holes 964, respectively, unless mentioned otherwise. Similar to base plate 814B, base plate 914B can have different regions with different sized gas distribution holes 964, but base plate 914B can have a horizontal dimension $914B_w$ (e.g., width) along an X-axis smaller than horizontal dimension $814B_w$ (e.g., width) of base plate 814. In addition, compared to base plate 814B, base plate 914B can have a different arrangement of gas distribution holes 964.

In some embodiments, base plate 914B can have four regions with four sets 980A-980D of gas distribution holes 964. In some embodiments, each of four sets 980A-980D can have gas distribution holes 964 with dimensions different from the other sets. In some embodiments, gas distribution holes 964 can each have dimensions substantially equal to or different from each other in the same set of set 980A, 980B, 980C, and/or 980D. In some embodiments, gas distribution holes 964 of set 980A can have the smallest dimensions compared to sets 980B-980D and gas distribution holes 964 of set 980C can have the largest dimensions compared to sets 980A-980B and 980D.

In some embodiments, gas distribution holes 964 of set 980A can each have a diameter ranging from about 1 mm to about 5 mm (e.g., about 1 mm, about 2 mm, about 3 mm, or about 4 mm). In some embodiments, gas distribution holes 964 of set 980C can each have a diameter ranging from about 8 mm to about 15 mm (e.g., about 8 mm, about 10 mm, about 12 mm, or about 15 mm). In some embodiments, gas distribution holes 964 of sets 980B and 980D can each have a diameter ranging from about 4 mm to about 8 mm (e.g., about 4 mm, about 6 mm, or about 8 mm). In some embodiments, gas distribution holes 964 of sets 980B and 980D can have dimensions equal to or different from each other. In some embodiments, the number of gas distribution holes 964 in each of sets 980A-980D can be equal to or different from each other. In some embodiments, base plate 914B can have horizontal dimension $914B_w$ (e.g., width) along an X-axis ranging from about 10 mm to about 30 mm (e.g., about 10 mm, about 15 mm, about 20 mm, or about 25 mm).

Similar to base plate 814B, the arrangements and dimensions of gas distribution holes 964 can be configured to control the volume of thermally conditioned gas discharged from different regions of a gas distribution element (e.g., gas distribution elements 114A-114B) to compensate for temperature variations in the thermally conditioned gas within the gas distribution element. The temperature variations can be compensated when the gas distribution element can have gas distribution holes 964 with the smallest dimensions (e.g., set 980A) positioned under or closer to the gas inlet port compared to larger gas distribution holes 964 (e.g., sets 980B-980D). In this position of base plate 914B with respect to the gas inlet port, gas distribution holes 964 of sets 980B and 980D with larger dimensions can be farther away from the gas inlet port and gas distribution holes 964 of set 980C with the largest dimensions can be farthest away from the gas inlet port. The variation in the dimensions of gas distribution holes 964 can depend on the variation of the thermally conditioned gas within the gas distribution element.

Referring to FIGS. 8-9, in some embodiments, base plate 814B can be a base plate for inner gas distribution element 114A and base plate 914B can be a base plate for outer gas distribution element 114B in plasma generation systems 104 and 404 of FIGS. 1 and 4, respectively.

Figure 10:
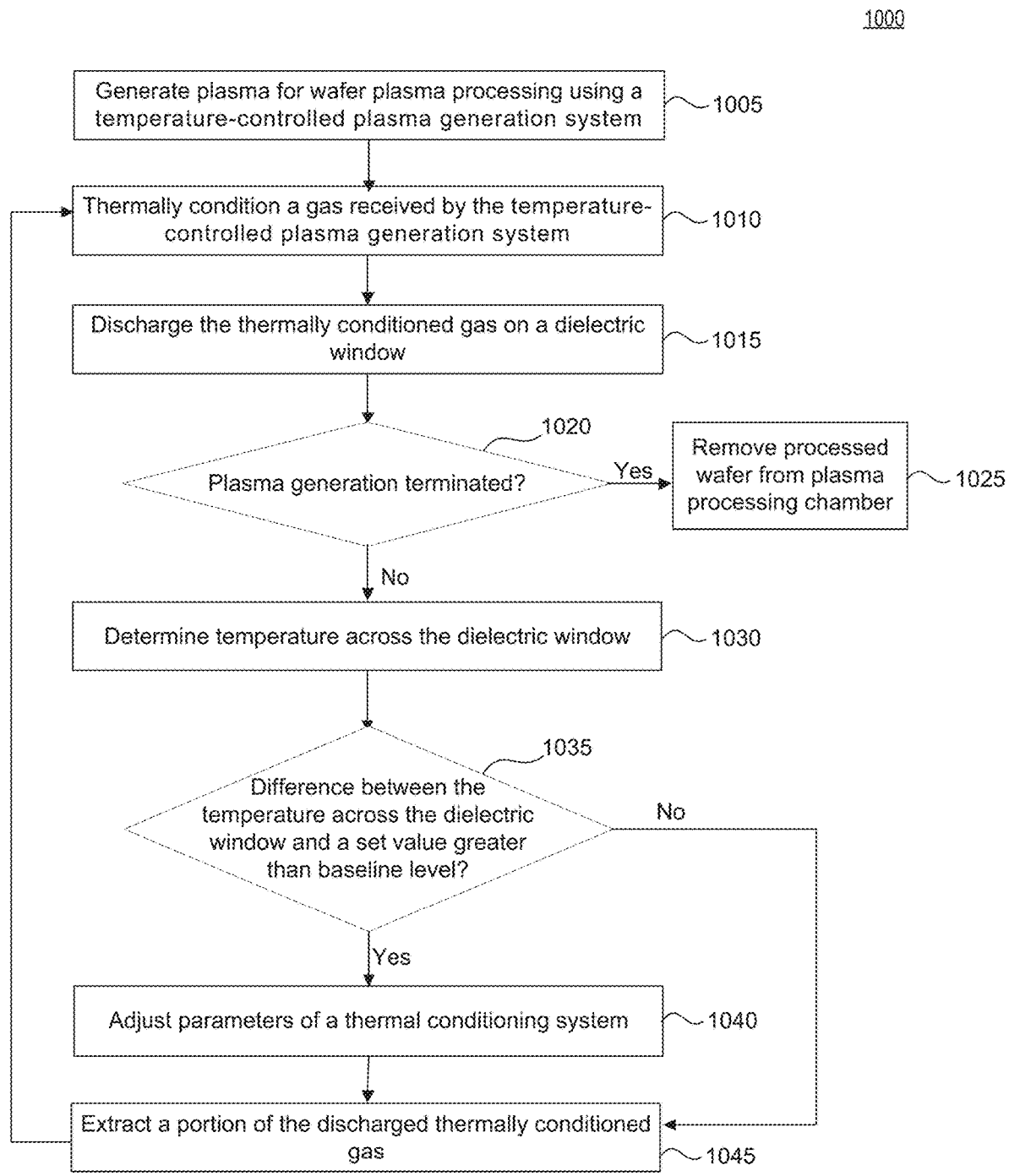
FIG. 10 is a flow chart of a method for regulating and maintaining a temperature across a dielectric window of a temperature-controlled plasma generation system, in accordance with some embodiments.

FIG. 10 is a flow diagram of an example method 1000 for regulating and maintaining a temperature across a dielectric window of a temperature-controlled plasma generation system, according to some embodiments. This disclosure is not limited to this operational description. Rather, other operations are within the spirit and scope of the present disclosure. It is to be appreciated that additional operations may be performed. Moreover, not all operations may be needed to perform the disclosure provided herein. Further, some of the operations may be performed simultaneously, or in a different order than shown in FIG. 10. In some implementations, one or more other operations may be performed in addition to or in place of the presently described operations. For illustrative purposes, method 1000 is described with reference to the embodiments of FIGS. 1, 3A-3B, 4, 5A-5B, 6, 7A-7B, and 8-9. However, method 1000 is not limited to these embodiments.

In operation 1005 of FIG. 10, a plasma is generated for wafer plasma processing using a temperature-controlled plasma generation system. For example, as shown and discussed with reference to FIG. 1, temperature-controlled plasma generation system 104 can be used to generate plasma within plasma processing chamber 102 for various plasma processes, such as etching or deposition on wafer 107.

In operation 1010 of FIG. 10, a gas received by the temperature-controlled plasma generation system is thermally conditioned. For example, as shown and discussed with reference to FIG. 4, thermal conditioning a gas (e.g., air or inert gas) received by temperature-controlled plasma generation system 404 can include receiving the gas by gas tube 550B of gas conditioning system 116B, directing the gas through gas tube 550A using gas circulation system 554, and heating or cooling the gas using thermal conditioning system 552. In some embodiments, heating or cooling can include flowing the gas through a heating coil or a fan within gas tube 550A, respectively. The gas can be thermally conditioned to a temperature ranging from about 70° C. to about 120° C. (e.g., about 70° C., about 80° C., about 90° C., about 100° C., about 110° C., or about 120° C.).

In operation 1015 of FIG. 10, the thermally conditioned gas is discharged on a dielectric window. For example, as shown and discussed with reference to FIG. 4, discharging the thermally conditioned gas on dielectric window 110 can include directing the thermally conditioned gas to gas distribution element 114B through gas inlet pipe 115B using gas circulation system 554. The discharging can further include discharging the thermally conditioned gas through gas distribution holes (e.g., holes 664 of FIG. 6, holes 864 of FIG. 8, or holes 964 of FIG. 9) onto dielectric window 110 while circulating the thermally conditioned gas within gas distribution element 114B. In some embodiments, gas circulation system 554 can include a blower for directing and circulating the thermally conditioned gas.

In operation 1020 of FIG. 10, the state of plasma generation is determined. For example, as shown and discussed with reference to FIG. 1, based on the plasma generating gas supplied into plasma processing chamber 102 through gas injector 120, control system 108 can output a control signal (not shown) indicating whether plasma generation in plasma processing chamber 102 is terminated. If the output control signal indicates the termination of plasma generation, then method 1000 can proceed to operation 1025, otherwise method 1000 can proceed to operation 1030.

In operation 1025 of FIG. 10, the plasma processed wafer is removed from the plasma processing chamber in response to the plasma generation being terminated. For example, as shown and discussed with reference to FIG. 1, wafer 107 can be removed from processing chamber 102 in response to the control signal from control system 108 indicating the termination of plasma generation in plasma processing chamber 102.

In operation 1030 of FIG. 10, the temperature across the dielectric window is determined. For example, as shown and discussed with reference to FIG. 4, determining the temperature across the dielectric window can include activating sensors 118A-118B and/or 119 based on control signals (not shown) from control system 108, measuring the temperatures using sensors 118A-118B and/or 119, and receiving the measured temperatures from sensors 118A-118B and/or 119 by control system 108.

In operation 1035 of FIG. 10, a difference between the determined temperatures and a desired temperature across the dielectric window is determined and the difference is compared to a baseline level. For example, as shown and discussed with reference to FIG. 1, a processor (not shown) of control system 108 can compare a desired temperature set in the processor with the temperatures across dielectric window 110 received from sensors 118A-118B and/or 119 and output a difference. The processor can compare the difference to a baseline level and output a signal indicating whether the difference is greater than, equal to, or less than the baseline level. The term "baseline level," as used herein, refers to a temperature variation level that has been deemed to have minimal impact on wafer plasma processing or have any appreciable impact on wafer yield loss. In some embodiments, the baseline level can be one or more stored values in a database, a server, or on a local storage medium in processor 640c.

If the processor outputs a signal indicating the difference is greater than the baseline level, then method 1000 can proceed to operation 1040 followed by operation 1045. In some embodiments, operations 1040 and 1045 can occur simultaneously if the processor outputs a signal indicating the difference is greater than the baseline level. Otherwise, if the processor outputs a signal indicating the difference is equal or below the baseline level, then method 1000 can proceed to operation 1045.

In operation 1040 of FIG. 10, a parameter of a thermal conditioning system is adjusted in response to the difference between the determined temperatures and a desired temperature across the dielectric window being greater than the baseline level. For example, as shown and discussed with reference to FIGS. 1, 4, and 5A-5B, control system 108 can dynamically adjust parameters of thermal conditioning system 552 to adjust the temperature of the thermally conditioned gas supplied to gas distribution elements 114A-114B. The dynamic adjustment can be based on the determined temperatures across the dielectric window.

In operation 1045 of FIG. 10, a portion of the discharged thermally conditioned gas is extracted. For example, as shown and discussed with reference to FIG. 4, extracting a portion of the discharged thermally conditioned gas can include drawing all or portions of the discharged thermally conditioned gas within chamber 442 through gas outlet port 444B using gas circulation system 554. In some embodiments, gas circulation system 554 can include a suction fan configured to draw the all or portions of the discharged thermally conditioned gas. After extraction, method 1000 can proceed to operation 1010 to thermally recondition and redistribute the extraction portion on dielectric window 110 through gas distribution elements 114A-114B.

The present disclosure provides example temperature-controlled plasma generation systems (e.g., plasma generation systems 104, 304, or 404) in plasma processing systems (e.g., plasma processing system 100) to prevent and/or mitigate the temperature dependent process drifts during plasma processing of a series of wafers to achieve plasma process repeatability and wafer-to-wafer reproducibility. In some embodiments, a temperature-controlled plasma generation system can include a dielectric window (e.g., dielectric window 110) and one or more gas distribution elements (e.g., gas distribution elements 114A, 114B, 314A, or 314B) positioned on the dielectric window. The one or more gas distribution elements can be configured to distribute thermally conditioned gas on the dielectric window and regulate the temperature across the dielectric window to be substantially uniform during wafer plasma processing.

In some embodiments, the one or more gas distribution elements can have ring-shaped tubular structures and a plurality of gas distribution holes (e.g., gas distribution holes 664, 864, or 964) configured to discharge the thermally conditioned gas onto a top surface of the dielectric window. In some embodiments, different regions of the one or more gas distribution elements can have different sets (e.g., sets 880A-880D or 980A-980D) of gas distribution holes. The dimension and density of each set of gas distribution holes can be different from each other. The sets of gas distribution holes can be strategically designed and arranged to control the thermally conditioned gas amount discharged across the dielectric window to provide substantially uniform amount of thermal energy (hot or cold) across the dielectric window and regulate the dielectric window temperature to be substantially uniform during wafer plasma processing.

In some embodiments, a plasma generation system includes a dielectric window, an inductive coil disposed on the dielectric window, a gas distribution element disposed on the dielectric window, and a gas conditioning system coupled to the gas distribution element. The gas distribution element is configured to discharge a thermally conditioned gas on the dielectric window and regulate a temperature across the dielectric window. The gas conditioning system is configured to supply the thermally conditioned gas to the gas distribution element.

In some embodiments, a plasma generation system includes a dielectric window, a gas injector coupled to the dielectric window, first and second inductive coils, first and second gas distribution elements, and a gas conditioning system coupled to the first and second gas distribution elements. The first and second inductive coils are disposed radially around the gas injector and on the dielectric window. The first and second gas distribution elements are disposed radially around the first and second inductive coils and on the dielectric window. Each of the first and second gas distribution elements is configured to discharge a thermally conditioned gas on the dielectric window. The gas conditioning system is configured to supply the thermally conditioned gas to the first and second gas distribution elements.

In some embodiments, a method for regulating a temperature across a dielectric window of a plasma generation system includes thermally conditioning a gas supplied to the plasma generation system and discharging the thermally conditioned gas on the dielectric window. The method further includes determining a difference between a temperature across the dielectric window and a set temperature value and adjusting a parameter of the plasma generation system in response to the difference being greater than a baseline level.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for regulating a temperature across a dielectric window of a plasma generation system, the method comprising:
   thermal conditioning, using a gas conditioner, a gas supplied to the plasma generation system to form a thermally conditioned gas;
   discharging, using a gas distributor, the thermally conditioned gas on the dielectric window;
   determining, using a controller, a difference between a temperature across the dielectric window and a predetermined temperature value; and
   adjusting, using the controller, a parameter of the plasma generation system in response to the difference being greater than a baseline level.

2. The method of claim 1, wherein thermally conditioning the gas comprises:
   receiving the gas through a gas tube of the gas conditioner;
   directing the gas through the gas tube using a gas circulator; and
   heating or cooling the gas using a thermal conditioner.

3. The method of claim 1, wherein discharging the thermally conditioned gas comprises directing the thermally conditioned gas to a gas distributor using a gas circulator.

4. The method of claim 1, wherein discharging the thermally conditioned gas comprises discharging the thermally conditioned gas through gas distribution holes in the gas distributor.

5. The method of claim 1, wherein discharging the thermally conditioned gas comprises discharging the thermally conditioned gas through first and second sets of gas distribution holes in the gas distributor, and
   wherein a number of the gas distribution holes in the first set is greater than a number of the gas distribution holes in the second set.

6. The method of claim 5, wherein a diameter of the gas distribution holes in the first set is smaller than a diameter of the gas distribution holes in the second set.

7. The method of claim 1, wherein adjusting the parameter of the plasma generation system comprises dynamically adjusting a parameter of a heating coil or a cooling fan of a thermal conditioner.

8. The method of claim 1, wherein determining the difference comprises:
activating, using the controller, sensors disposed on the dielectric window; and
measuring the temperature across the dielectric window using the sensors.

9. The method of claim 1, further comprising extracting a portion of the thermally conditioned gas after discharging on the dielectric window in response to the difference being equal to or less than the baseline level.

10. The method of claim 1, further comprising:
extracting, using a gas circulator, a portion of the thermally conditioned gas after discharging on the dielectric window; and
thermally reconditioning, using the gas conditioner, the portion of the thermally conditioned gas.

11. A method, comprising:
conditioning, using a gas conditioner, a gas supplied to a processing chamber to form a conditioned gas;
discharging, using a gas distributor, the conditioned gas on a dielectric window of the processing chamber;
determining, using a controller, a difference between a temperature across the dielectric window and a predetermined temperature value;
extracting, using a gas circulator, a portion of the conditioned gas after discharging on the dielectric window in response to the difference being equal to or less than a baseline level; and
reconditioning, using the gas conditioner, the portion of the conditioned gas.

12. The method of claim 11, wherein discharging the conditioned gas comprises discharging different volumes of the conditioned gas on different regions of the dielectric window using the gas distributor.

13. The method of claim 11, wherein discharging the conditioned gas comprises:
discharging a first volume of the conditioned gas through a first set of openings in the gas distributor and on a first region of the dielectric window; and
discharging a second volume of the conditioned gas through a second set of openings in the gas distributor and on a second region of the dielectric window.

14. The method of claim 13, wherein a diameter of the openings in the first set of openings is smaller than a diameter of the openings in the second set of openings.

15. The method of claim 11, further comprising adjusting, using the gas conditioner, a temperature of the conditioned gas prior to discharging the conditioned gas in response to the difference being greater than the baseline level.

16. The method of claim 11, wherein determining the difference comprises:
activating, using the controller, sensors disposed on the dielectric window; and
measuring the temperature across the dielectric window using the sensors.

17. A method, comprising:
supplying, using a gas conditioner, a thermally conditioned gas to a gas distributor;
discharging, using the gas distributor, the thermally conditioned gas on a window of a processing chamber;
activating, using a controller, sensors disposed on the window and under the gas distributor;
measuring, using the sensors, a temperature across the window; and
adjusting, using the gas conditioner, a temperature of the thermally conditioned gas prior to discharging the thermally conditioned gas on the window.

18. The method of claim 17, wherein discharging the thermally conditioned gas comprises discharging different volumes of the thermally conditioned gas on different regions of the window.

19. The method of claim 17, wherein discharging the thermally conditioned gas comprises:
discharging a first volume of the thermally conditioned gas on a first region of the window; and
discharging a second volume of the thermally conditioned gas on a second region of the window.

20. The method of claim 17, wherein supplying the thermally conditioned gas comprises:
receiving a gas through a gas tube of the gas conditioner; and
heating or cooling the gas using a thermal conditioner.

* * * * *

UNITED STATES PATENT AND TRADEMARK OFFICE
CERTIFICATE OF CORRECTION

| | | |
|---|---|---|
| PATENT NO. | : 12,400,838 B2 | Page 1 of 1 |
| APPLICATION NO. | : 17/875524 | |
| DATED | : August 26, 2025 | |
| INVENTOR(S) | : Liu | |

It is certified that error appears in the above-identified patent and that said Letters Patent is hereby corrected as shown below:

In the Specification

In Column 6, Line 15, delete "114Ab-114Bb" and insert -- $114A_b$-$114B_b$ --, therefor.

In Column 6, Line 20, delete "114Ab-114Bb." and insert -- $114A_b$-$114B_b$. --, therefor.

Signed and Sealed this
Eighteenth Day of November, 2025

John A. Squires
*Director of the United States Patent and Trademark Office*